United States Patent
Hsiao et al.

(10) Patent No.: US 6,437,611 B1
(45) Date of Patent: Aug. 20, 2002

(54) MOS OUTPUT DRIVER CIRCUIT WITH LINEAR I/V CHARACTERISTICS

(75) Inventors: Shun-Yuan Hsiao, Hsinchu; Chun-Ming Leu, Taoyuan, both of (TW)

(73) Assignee: Silicon Integrated Systems Corporation, Hsinchu (TW)

(*) Notice: Subject to any disclaimer, the term of this patent is extended or adjusted under 35 U.S.C. 154(b) by 0 days.

(21) Appl. No.: 09/984,405

(22) Filed: Oct. 30, 2001

(51) Int. Cl.[7] ................................................. H03K 3/00
(52) U.S. Cl. ...................................... 327/108; 327/112
(58) Field of Search ................................ 327/108, 112, 327/427, 434–437, 374; 326/82–87, 63, 68

(56) References Cited

U.S. PATENT DOCUMENTS

| | | | | |
|---|---|---|---|---|
| 5,206,544 A | * | 4/1993 | Chen et al. | 326/103 |
| 5,777,497 A | * | 7/1998 | Han | 326/26 |
| 6,060,938 A | * | 5/2000 | Morrill | 326/27 |
| 6,137,322 A | * | 10/2000 | Ten Eyck | 327/112 |
| 6,236,239 B1 | * | 5/2001 | Kogushi | 326/27 |
| 6,236,248 B1 | * | 5/2001 | Koga | 326/27 |
| 6,255,867 B1 | * | 7/2001 | Chen | 327/108 |

* cited by examiner

Primary Examiner—My-Trang Nuton
(74) Attorney, Agent, or Firm—Nixon Peabody LLP; Donald R. Studebaker

(57) ABSTRACT

The present invention discloses an output driver circuit providing linear I/V characteristics, i.e. constant output impedance, during output voltage transitions. The output driver circuit includes a first input transistor, a second input transistor, a first pair of transistors, a second pair of transistors, a first output transistor and a second output transistor. The first input transistor inputs a first input signal and has an output node coupled to the output node of the output driver circuit. The second input transistor inputs a second input signal and has an output node coupled to the output node of the output driver circuit. The first pair of transistors is responsive to a first control signal and the output signal for generating a second control signal. The second pair of transistors is responsive to a third control signal and the output signal for generating a fourth control signal. The first output transistor is operative to receive the second control signal and has an output node coupled to the output node of the output driver circuit. The second output transistor is operative to receive the fourth control signal and has an output node coupled to the output node of the output driver circuit.

26 Claims, 5 Drawing Sheets

MOS OUTPUT DRIVER CIRCUIT WITH LINEAR I/V CHARACTERISTICS

BACKGROUND OF THE INVENTION

1. Field of Invention

The present invention is related to MOS output driver circuit having linear I/V characteristics.

2. Description of the Related Art

Semiconductor chips containing MOS circuit are well known and widely deployed because of their high speed, low power, and high integration characteristics. For example, a MOS output driver circuit is usually implemented to drive a pad to the required voltage level for conveying the desired logic values.

Please refer to FIG. 1 which illustrates a conventional MOS output driver circuit. A source node of PMOSFET 140 is connected to a voltage reference, Vss. The voltage reference provides a relatively stable voltage source of design magnitude, such as 3 or 5 volt bias commonly used in MOS device. As the initial voltage level of input node 110 and input node 120 are low, the initial voltage level of output node 130 is high. When input node 120 and input node 140 respectively receive high-voltage-level signals from outputs of a predriver (not shown), the source node and the gate node of PMOSFET 140 are both pulled high, such that PMOSFET 140 is turned off. Meanwhile, the gate node of NMOSFET 150 is pulled high and the source node of NMOSFET 150 is grounded, such that the NMOSFET 150 is turned on. At the instance, the drain node and the gate node of NMOSFET 150 are both pulled high, so NMOSFET 150 operates in saturation region. Since NMOSFET 150 is on, the voltage level of output node 130 starts decreasing. When the voltage level of output node 130 gets lower, NMOSFET 150 enters triode region eventually. The above operation is called a pull-down transition of the output signal.

Similarly, the conventional MOS output driver circuit experiences a pull-up transition of the output signal when the PMOSFET 140 is turned on and NMOSFET 150 is off.

When NMOSFET 150 operates from saturation region to triode region, the value of output impedance, viewed from the output node 130, is decreasing. Therefore, the conventional MOS output driver circuit sees impedance fluctuation when a pull-up or pull-down transition occurred. It is difficult for the conventional MOS output driver circuit to provide constant output impedance when a pull-up or pull-down transition occurred.

SUMMARY OF THE INVENTION

The present invention overcomes the impedance fluctuation problem by introducing a compensation circuit within the output driver circuit.

It is therefore the main objective of the present invention to provide an output driver circuit with good signaling performance.

It is yet another objective of the present invention to provide an output driver circuit having linear I/V characteristics, i.e. constant output impedance.

It is yet another objective of the present invention to provide an output driver circuit having invariant output impedance and being easy to be implemented by today's standard CMOS IC technology.

The output driver circuit includes a first input transistor, a second input transistor, a first pair of transistors, a second pair of transistors, a first output transistor and a second output transistor. The first input transistor inputs a first input signal and has an output node coupled to the output node of the output driver circuit. The second input transistor inputs a second input signal and has an output node coupled to the output node of the output driver circuit. The first pair of transistors is responsive to a first control signal and the output signal for generating a second control signal. The second pair of transistors is responsive to a third control signal and the output signal for generating a fourth control signal. The first output transistor is operative to receive the second control signal and has an output node coupled to the output node of the output driver circuit. The second output transistor is operative to receive the fourth control signal and has an output node coupled to the output node of the output driver circuit.

DETAILED DESCRIPTION OF THE INVENTION

Figure 1:
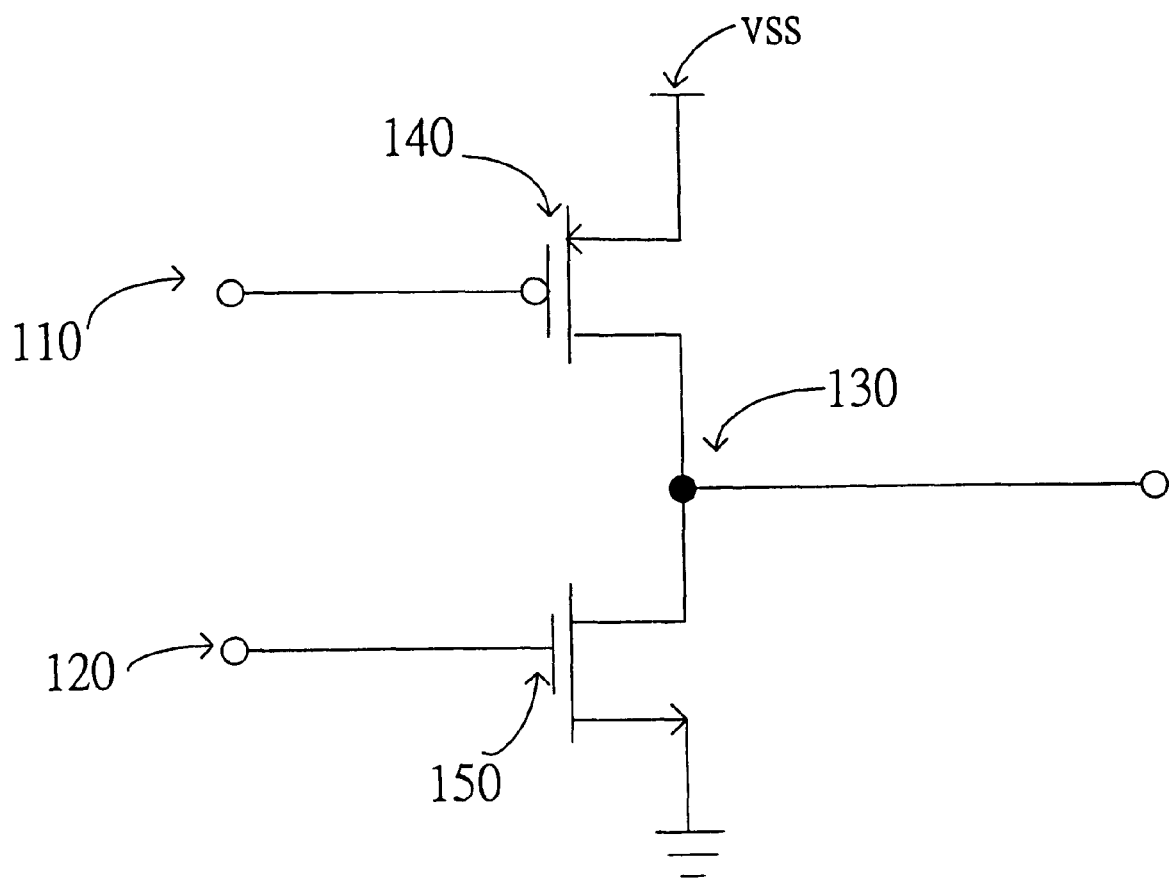
FIG. 1 schematically illustrates a conventional MOS output driver circuit.

Although the circuits described herein are demonstrated with field effect transistors (FETS), yet the invention is intended to apply to any type of circuitry including, without limitation, bipolar junction transistor or combination of FETS with bipolar junction transistors, or other sort of semiconductor technology. Moreover, the invention may be implemented in any manner, such as with discrete devices or in an integrated circuit fashion.

Please refer to FIG. 2 (a), the first embodiment of the invention includes a first input transistor 210, preferably a PMOSFET device, a second input transistor 215, preferably an NMOSFET device, a first pair of transistors, PMOSFET 220 and NMOSFET 225, a second pair of transistors, PMOSFET 230 and NMOSFET 235, a first output transistor 240, preferably a PMOSFET device, a second output transistor 245, preferably an NMOSFET device. The output driver circuit further includes inverters 250 and 255 as shown.

Suppose the output node 270 is initially pulled high and the input nodes 260 and 265 receive high signal respectively from the predriver (not shown). The following describes a pull-down process. The source node and the gate node of PMOSFET 210 are both pulled high, and PMOSFET 210 is turned off. The source node of NMOSFET 215 is grounded while the gate node of NMOSFET 215 is pulled high, so NMOSFET 215 is turned on. The inverter 250 outputs a low signal. The output node of inverter 250 and the gate nodes of PMOSFET 220 and NMOSFET 225 are coupled together. Since the gate node of PMOSFET 220 receives a low signal and the source node of PMOSFET 220 is connected to the voltage reference, the PMOSFET 220 is turned on. On the contrary, NMOSFET 225 is turned off because the gate node of the NMOSFET 225 is pulled low and the source node is pulled high due to coupling to the output node 270.

As NMOSFET 225 is turned off, no current is flowing through the node 280. So the node 280 traces the high voltage level of the output node 270. At this point, PMOSFET 240 is turned off. Since both inverters 250, 255 output low signal, and the transistors 220, 225 and 230, 235 are symmetrical, it is easy to derive that PMOSFET 230 is turned on and NMOSFET 235 is turned off. The gate node of NMOSFET 245 is coupled to the node 290. The node 290 traces the high voltage level of the output node 270. NMOSFET 245 is turned on.

It is noted that all operations mentioned above are complete substantially at the same time. NMOSFET 215 and NMOSFET 245 are both turned on and operating in saturation region. Viewed from the output node 270, the NMOSFET 215 and NMOSFET 245 act like two output resistors connected in parallel. Because NMOSFET 215 operates in saturation region, the output resistance of NMOSFET 215 is high. Since the voltage levels of node 290 and the output node 270 are both high, NMOSFET 245 is in diode-connected configuration. So the output resistance of NMOSFET 245 is relatively low. The output resistance of NMOSFET 245 contributes most of the output impedance of the output driver circuit shown in FIG. 2(a). By carefully choosing ratio of the size (B) of NMOSFET 215 and the size (D) of NMOSFET 245, we obtain a highly linear output I/V transfer curve during the transition. Herein, size of an MOSFET is defined as (width/length) of the device. Thus a constant output impedance driver circuit is achieved.

PMOSFET 230 and NMOSFET 245 are turned on, the output signal starts decreasing to experience the pull-down process. The voltage level appearing on the drain node of NMOSFET 215 is decreasing. Eventually, NMOSFET 215 enters deep triode region the output impedance of which is much lower than that in saturation region. Meanwhile, the voltage level at the node 290 starts decreasing as that at the output node 270. The output impedance of NMOSFET 245 gets higher and higher until NMOSFET 245 is turned off.

Suppose the output node 270 is initially pulled low and the input nodes 260 and 265 receive low signal respectively from the predriver (not shown). The following describes a pull-up process. The source node and the gate node of PMOSFET 210 are both pulled low, and PMOSFET 210 is turned on. The source node of NMOSFET 215 grounded while the gate node of NMOSFET 215 is pulled low, so NMOSFET 215 is turned off. The inverter 250 outputs a high signal. The output node of inverter 250 and the gate nodes of PMOSFET 220 and NMOSFET 225 are coupled together. Since the gate node of PMOSFET 220 receives a high signal and the source node of PMOSFET 220 is connected to the voltage reference, the PMOSFET 220 is turned off. On the contrary, NMOSFET 225 is turned on because the gate node of the NMOSFET 225 is pulled high and the source node is pulled low due to coupling to the output node 270.

As PMOSFET 220 is turned off, no current is flowing through the node 280. So the node 280 traces the low voltage level of the output node 270. At this point, PMOSFET 240 is turned on. Since both inverters 250, 255 output high signal, and the transistor pairs 220, 225 and 230, 235 are symmetrical, it is easy to derive that PMOSFET 230 is turned off and NMOSFET 235 is turned on. The gate node of NMOSFET 245 is coupled to node 290. The node 290 traces the low voltage level of the output node 270. NMOSFET 245 is turned off.

It is noted that all operations mentioned above are complete substantially at the same time. PMOSFET 210 and PMOSFET 240 are both turned on and operating in saturation region. Viewed from the output node 270, the PMOSFET 210 and PMOSFET 240 act like two output resistors connected in parallel. Because PMOSFET 210 operates in saturation region, the output resistance of PMOSFET 210 is high. Since the voltage levels of node 280 and the output node 270 are both low, PMOSFET 240 is in diode-connected configuration. So the output resistance of PMOSFET 240 is relatively low. The output resistance of PMOSFET 240 contributes most of the output impedance of the output driver circuit shown in FIG. 2(a). By carefully choosing ratio of the size (A) of PMOSFET 210 and the size (C) of PMOSFET 240, we obtain a highly linear output I/V transfer curve during the transition. Herein, size of an MOSFET is defined as (width/length) of the device. Thus a constant output impedance driver circuit is achieved.

NMOSFET 225 and PMOSFET 240 are turned on, the output signal starts increasing to experience the pulled-up process. The voltage level appearing on the drain node of PMOSFET 210 is increasing. Eventually, PMOSFET 210 enters deep triode region the output impedance of which is much lower than that in saturation region. Meanwhile, the voltage level at the node 280 starts increasing as that at the output node 270. The output impedance of PMOSFET 240 gets higher and higher until PMOSFET 240 is turned off.

Figure 2A:
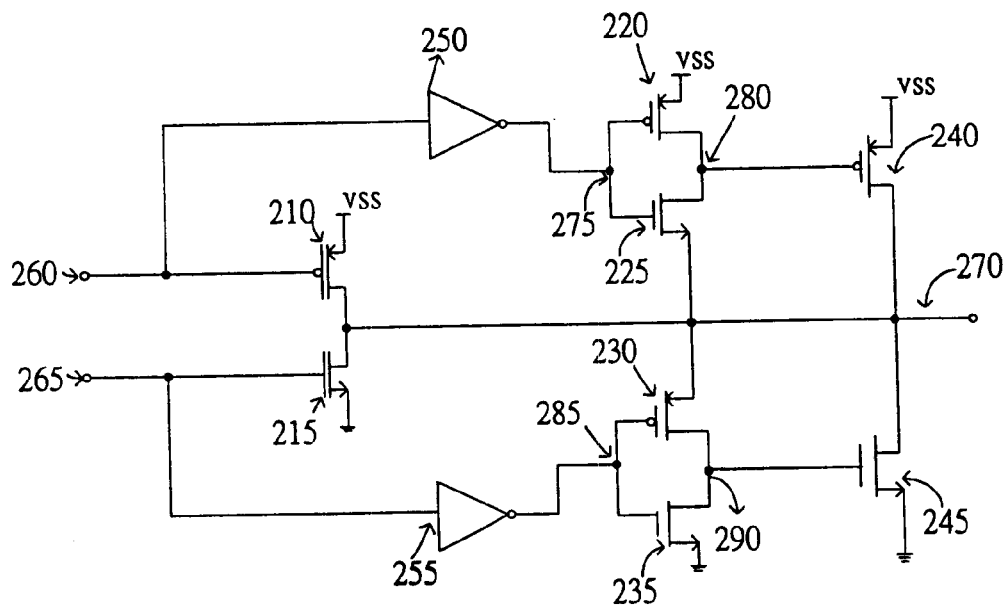
FIGS. 2 (a) to (d) respectively illustrates four preferred embodiments of the present invention.
Figure 2B:
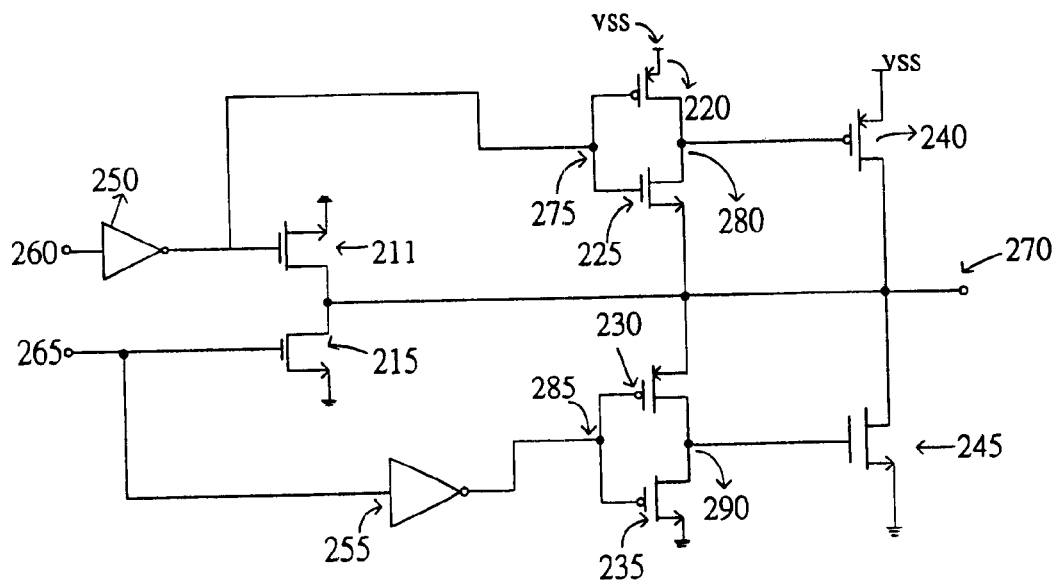
Figure 2C:
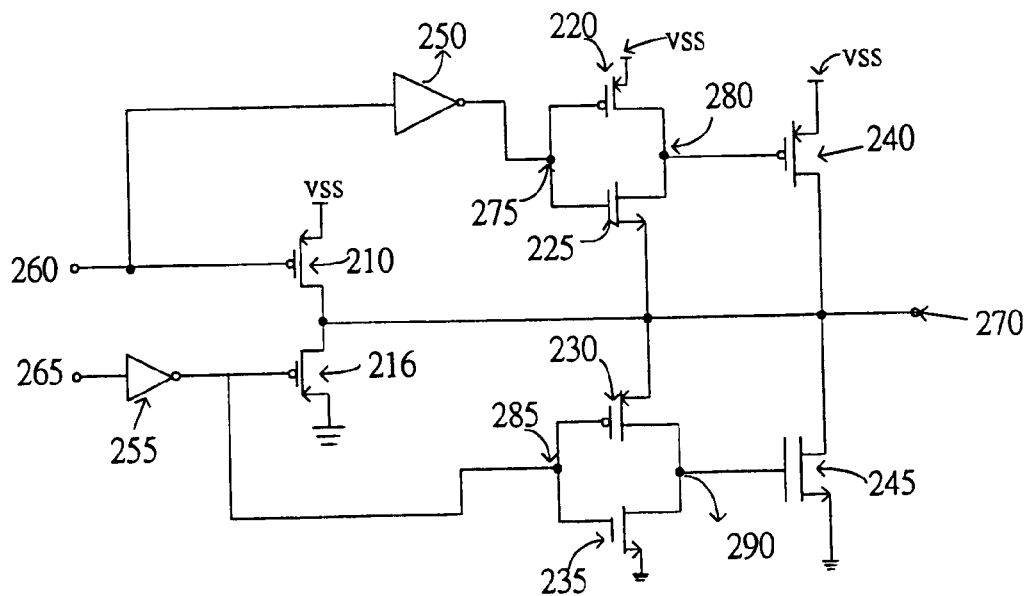
Figure 2D:
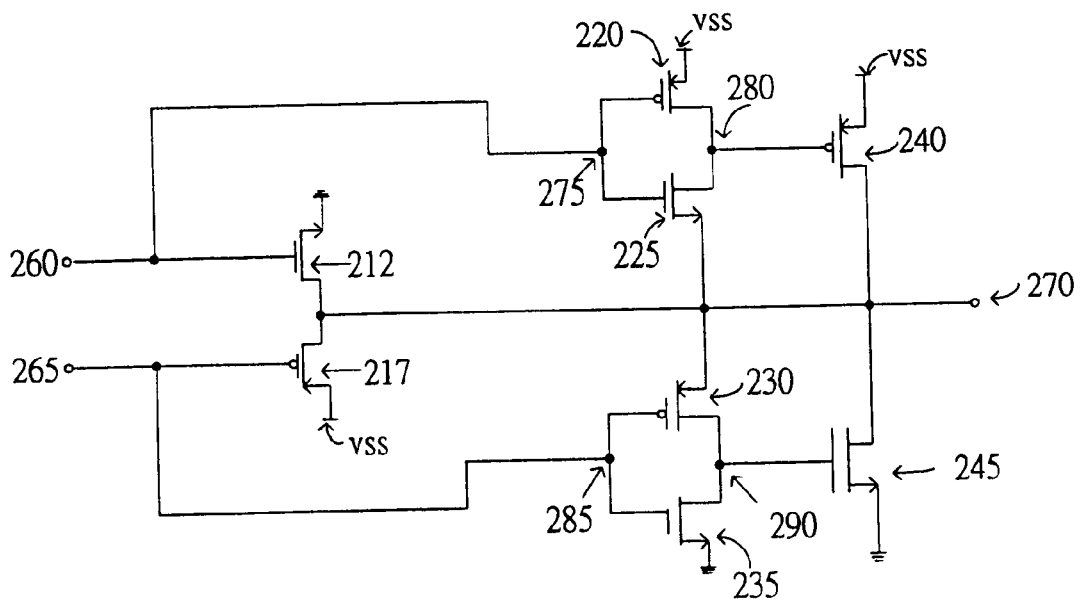
Figure 3A:
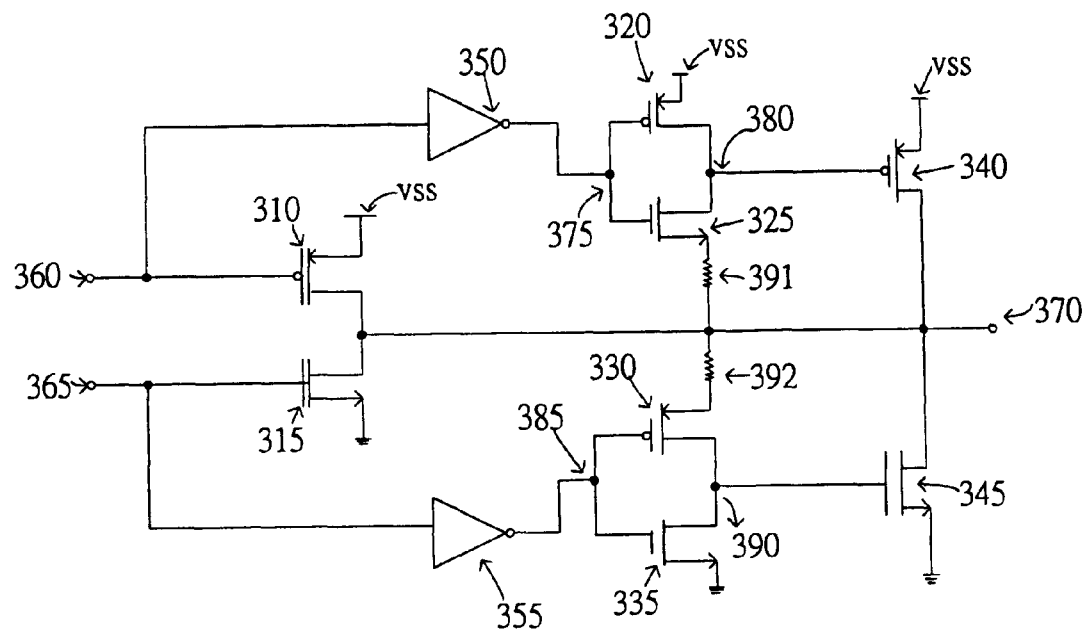
FIGS. 3 (a) to (d) respectively illustrates another four preferred embodiments of the present invention.
Figure 3B:
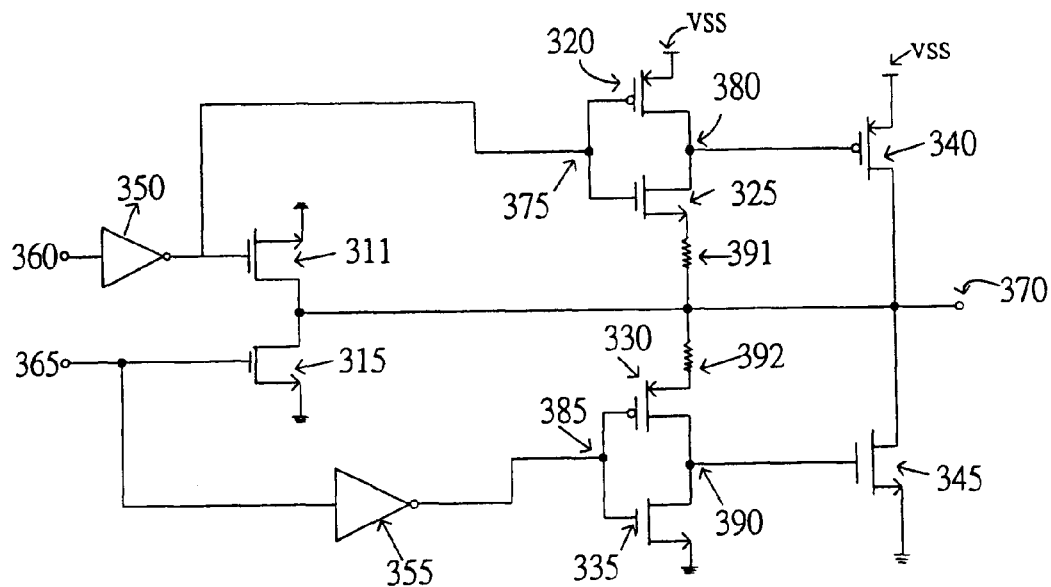
Figure 3C:
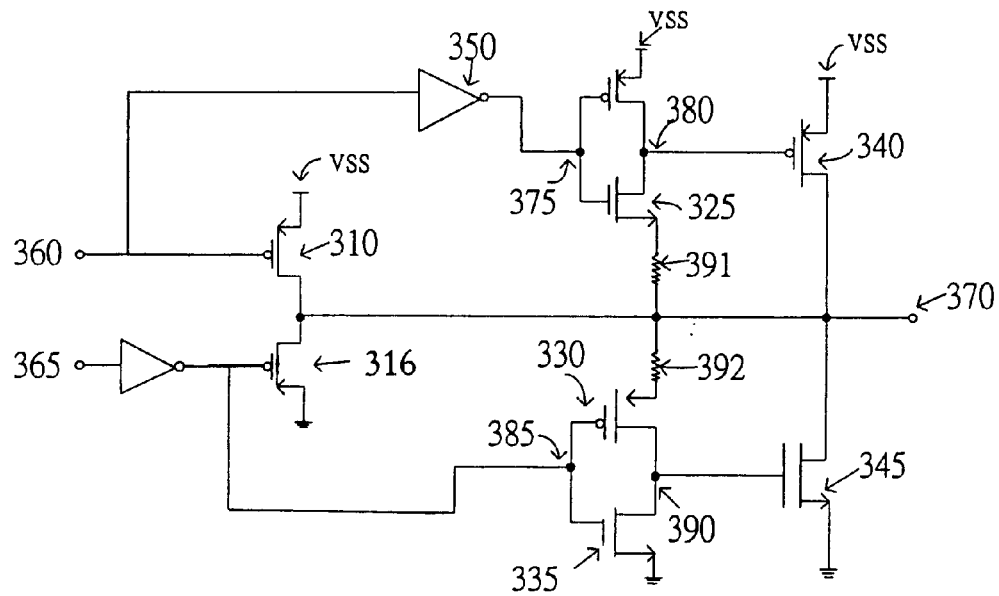
Figure 3D:
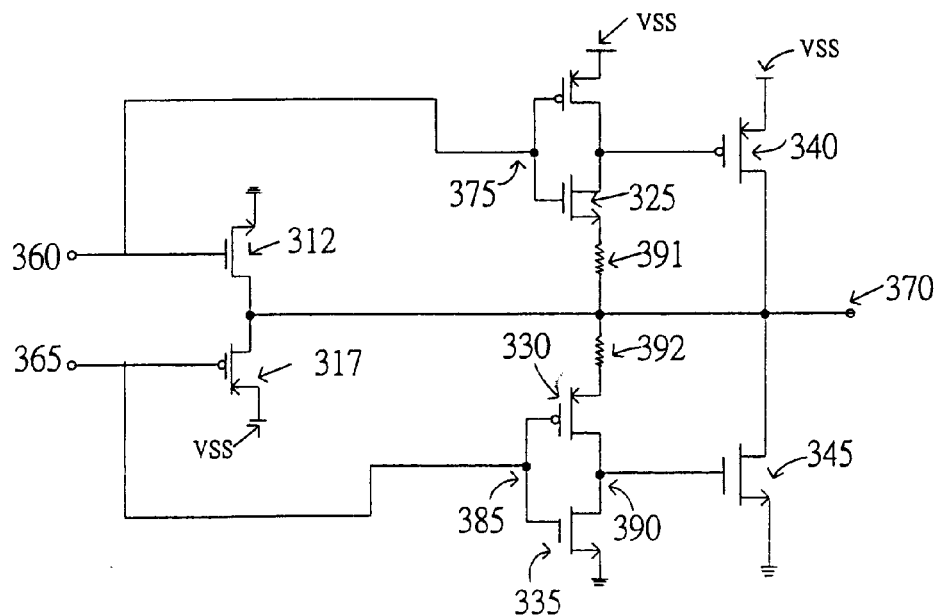

To achieve the objective of the invention, embodiments shown in FIG. 2 (b), FIG. 2(c) and FIG. 2(d) are provided.

In FIG. 2 (b), an NMOSFET 211 is used to receive the input signal 260 via an inverter 250. Assume that initially the output node 270 is at high signal level and the input node 260 and 265 receive high signals from the predriver respectively. Then NMOSFET 215 is turned on. The gate node of NMOSFET 211 receives the low output signal from the inverter 250, and therefore NMOSFET 211 is turned off. It is easy to derive that the operations of FIG. 2(b) are the same as the operations of the output driver circuit in FIG. 2 (a).

In FIG. 2 (c), a PMOSFET 216 is used to receive the input signal 265 via an inverter 255. Assume that initially the output node 270 is at high signal level and the input node 260 and 265 receive high signals from the predriver respectively. PMOSFET 210 is turned on and NMOSFET 216 is turned off. The gate node of PMOSFET 216 receives the low output signal from the inverter 255, and therefore PMOSFET 216 is turned off. It is easy to derive that the operations of FIG. 2(c) are the same as the operations of the output driver circuit in FIG. 2 (a).

In FIG. 2 (d), NMOSFET 212 and PMOSFET 217 are used instead. No inverter is required. It is easy to derive that the operations of FIG. 2(d) are the same as the operations of the output driver circuit in FIG. 2 (a).

To protect the driver circuit of the invention from the ESD (Electro Static Discharge) event, a resistor is introduced in the invention as shown in FIG. 3(a), FIG. 3(b), FIG. 3(c) and FIG. 3(d).

Comparing FIG. 3 (a) with FIG. 2(a), it is noted that the resistor 391 is connected between the source node of NMOSFET 325 and the output node 370. The resistor 392 is connected between the source node of PMOSFET 330 and the output node 370. The resistor 391 and 392 respectively provides discharging path when ESD occurs, thus preventing the damage of transistor devices in the circuit. The operations of the output driver circuit of FIG. 3 (a) are basically the same as in FIG. 2 (a).

Similarly, FIG. 3 (b) discloses an output driver circuit shown in FIG. 2 (b) along with a ESD protection. The operations of the output driver circuit of FIG. 3 (b) are basically the same as in FIG. 2 (b).

Similarly, FIG. 3 (c) discloses an output driver circuit shown in FIG. 2 (c) along with a ESD protection. The operations of the output driver circuit of FIG. 3 (c) are basically the same as in FIG. 2 (c).

Similarly, FIG. 3 (d) discloses an output driver circuit shown in FIG. 2 (d) along with a ESD protection. The operations of the output driver circuit of FIG. 3 (d) are basically the same as in FIG. 2 (d).

In the foregoing specification the invention has been described with reference to specific embodiments. It will, however, be evident that various modification and changes may be made to thereto without departing from the broader spirit and scope of the invention. The specification and drawings are, accordingly, to be regarded in an illustrative rather than restrictive sense. Thus, it is intended that the present invention covers the modification and variations of this invention provided they come within the scope of the appended claims and their equivalents.

What is claimed is:

1. An output driver circuit for providing an output signal at an output node experiencing a large pull-down or pull-up voltage excursion with a substantially constant output impedance, comprising:
   a first input transistor of a size A inputting a first input signal, the first input transistor having an output node coupled to the output node of the output driver circuit, the size of a transistor being defined as (width/length) of the transistor;
   a second input transistor of a size B inputting a second input signal, the second input transistor having an output node coupled to the output node of the output driver circuit;
   a first pair of transistors, responsive to a first control signal and the output signal, for generating a second control signal, wherein the first control signal responsive to the first input signal;
   a second pair of transistors, responsive to a third control signal and the output signal, for generating a fourth control signal, wherein the third control signal responsive to the second input signal;
   a first output transistor of a size C operative to receive the second control signal, the first output transistor having an output node coupled to the output node of the output driver circuit; and
   a second output transistor of a size D operative to receive the fourth control signal, the second output transistor having an output node coupled to the output node of the output driver circuit;
   wherein ratio of A/C and ratio of B/D are such that the substantially constant output impedance is achieved as large pull-down or pull-up voltage excursion at the output node occurs.

2. The output driver circuit of claim 1, wherein the first input transistor has a gate node receiving the first input signal, a source node coupled to a voltage reference (Vss), and the output node of the first input transistor is a drain node.

3. The output driver circuit of claim 1, wherein the circuit further comprises a first inverter, responsive to the first input signal, for generating the first control signal.

4. The output driver circuit of claim 1, wherein the first input transistor has a gate node receiving the first input signal via an inverter, a source node coupled to a reference ground (GND), and the output node of the first input transistor is a drain node.

5. The output driver circuit of claim 1, wherein the second input transistor has a gate node receiving the second input signal, a source node coupled to a reference ground (GND), and the output node of the second input transistor is a drain node.

6. The output driver circuit of claim 1, wherein the circuit further comprises a second inverter, responsive to the second input signal, for generating the third control signal.

7. The output driver circuit of claim 6, wherein the second input transistor has a gate node receiving the second input signal via an inverter, a source node coupled to a reference ground and the output node of the second transistor is a drain node.

8. The output driver circuit of claim 1, wherein the first input transistor has a gate node receiving the first input signal, a source node coupled to a reference ground (GND) and the output node of the first input transistor is a drain node.

9. The output driver circuit of claim 1, wherein the second input transistor has a gate node receiving the second input signal, a source node coupled to a voltage reference and the output node of the second input transistor is a drain node.

10. The output driver circuit of claim 1, wherein the first pair of transistors comprises:
    a first transistor having a source node coupled to a voltage reference, a drain node coupled to a gate node of the first output transistor, and a gate node receiving the first control signal; and
    a second transistor complementary to the first transistor, the second transistor having a source node coupled to the output node of the driver circuit, a drain node coupled to a drain node of the first transistor, and a gate node coupled to the gate node of the first transistor.

11. The output driver circuit of claim 1, wherein the second pair of transistors comprises:
    a third transistor having a source node coupled to the output node of the driver circuit, a drain node coupled to a gate node of the second output transistor, and a gate node receiving the third control signal; and
    a fourth transistor complementary to the third transistor, the fourth transistor having a source node coupled to a reference ground (GND), a drain node coupled to a drain node of the first transistor, a gate node coupled to the gate node of the first transistor.

12. The output driver circuit of claim 1, wherein the first output transistor has a source node coupled to a voltage reference and a drain node coupled to the output node.

13. The output driver circuit of claim 1, wherein the second output transistor has a source node coupled to a reference ground (GND) and a drain node coupled to the output node.

14. An output driver circuit for providing an output signal at an output node experiencing a large pull-down or pull-up voltage excursion with a substantially constant output impedance, comprising:
    a first input transistor of a size A inputting a first input signal, the first input transistor having an output node coupled to the output node of the output driver circuit, the size of a transistor being defined as (width/length) of the transistor;
    a second input transistor of a size B inputting a second input signal, the second input transistor having an output node coupled to the output node of the output driver circuit;
    a first pair of transistors, responsive to a first control signal and the output signal, for generating a second control signal, wherein the first control signal responsive to the first input signal;
    a second pair of transistors, responsive to a third control signal and the output signal, for generating a fourth control signal, wherein the third control signal responsive to the second input signal;

a first output transistor of a size C operative to receive the second control signal, the first output transistor having an output node coupled to the output node of the output driver circuit;

a second output transistor of a size D operative to receive the fourth control signal, the second output transistor having an output node coupled to the output node of the output driver circuit;

a first resistor for providing ESD protection to the first pair of transistors; and a second resistor for providing ESD protection to the second pair of transistors;

wherein ratio of A/C and ratio of B/D are such that the substantially constant output impedance is achieved as large pull-down or pull-up voltage excursion at the output node occurs.

15. The output driver circuit of claim 14, wherein the first input transistor has a gate node receiving the first input signal, a source node coupled to a voltage reference, and the output node of the first input transistor is a drain node.

16. The output driver circuit of claim 14, wherein the circuit further comprises a first inverter, responsive to the first input signal, for generating the first control signal.

17. The output driver circuit of claim 16, wherein the first input transistor has a gate node receiving the first input signal via an inverter, a source node coupled to a reference ground (GND), and the output node of the first input transistor is a drain node.

18. The output driver circuit of claim 14, wherein the second input transistor has a gate node receiving the second input signal, a source node coupled to a reference ground (GND), and the output node of the second input transistor is a drain node.

19. The output driver circuit of claim 14, wherein the circuit further comprises a second inverter, responsive to the second input signal, for generating the third control signal.

20. The output driver circuit of claim 14, wherein the second input transistor has a gate node receiving the second input signal via an inverter, a source node coupled to a reference ground and the output node of the second transistor is a drain node.

21. The output driver circuit of claim 20, wherein the first input transistor has a gate node receiving the first input signal, a source node coupled to a reference ground (GND) and the output node of the first input transistor is a drain node.

22. The output driver circuit of claim 14, wherein the second input transistor has a gate node receiving the second input signal, a source node coupled to a voltage reference and the output node of the second input transistor is a drain node.

23. The output driver circuit of claim 14, wherein the first pair of transistors comprises:

a first transistor having a source node coupled to a voltage reference, a drain node coupled to a gate node of the first output transistor, and a gate node receiving the first control signal; and a second transistor complementary to the first transistor, the second transistor having a source node coupled to the output node of the driver circuit, a drain node coupled to a drain node of the first transistor, and a gate node coupled to the gate node of the first transistor.

24. The output driver circuit of claim 14, wherein the second pair of transistors comprises:

a third transistor having a source node coupled to the output node of the driver circuit, a drain node coupled to a gate node of the second output transistor, and a gate node receiving the third control signal; and a fourth transistor complementary to the third transistor, the fourth transistor having a source node coupled to a reference ground (GND), a drain node coupled to a drain node of the first transistor, a gate node coupled to the gate node of the first transistor.

25. The output driver circuit of claim 14, wherein the first output transistor has a source node coupled to a voltage reference and a drain node coupled to the output node.

26. The output driver circuit of claim 14, wherein the second output transistor has a source node coupled to a reference ground (GND) and a drain node coupled to the output node.

* * * * *